United States Patent [19]

Madden

[11] 4,081,743

[45] Mar. 28, 1978

[54] CELL DISCHARGE VOLTAGE MONITOR CIRCUIT FOR CELL CAPACITY GRADING AND METHOD FOR GRADING

[75] Inventor: James A. Madden, Gainesville, Fla.

[73] Assignee: General Electric Company, Columbus, Ohio

[21] Appl. No.: 714,226

[22] Filed: Aug. 13, 1976

[51] Int. Cl.² .......................................... G01N 27/42
[52] U.S. Cl. ............................. 324/29.5; 324/73 AT; 320/13; 320/48
[58] Field of Search ............. 320/48; 324/29.5, 30 R, 324/73 AT; 209/71

[56] References Cited

U.S. PATENT DOCUMENTS

| 1,832,948 | 11/1931 | Schmidt | 324/73 AT |
| 3,939,421 | 2/1976 | Battinger | 324/29.5 |
| 3,969,667 | 7/1976 | McWilliams | 324/29.5 |

Primary Examiner—M. Tokar
Attorney, Agent, or Firm—Morgan, Finnegan, Pine, Foley & Lee

[57] ABSTRACT

A circuit utilized in a cell capacity grading machine for discharging a cell to a predetermined cell voltage which approximates the total discharge of the capacity of the cell. An indicator is provided for automatically indicating the termination of discharge of the cell and for initiating a cell ejection. Cells are capacity graded by ejection from a movable transport at spaced locations, each location corresponding to cells having a predetermined capacity range.

25 Claims, 3 Drawing Figures

CELL DISCHARGE VOLTAGE MONITOR CIRCUIT FOR CELL CAPACITY GRADING AND METHOD FOR GRADING

BACKGROUND OF THE INVENTION

This invention relates to machines for measuring the capacity of cells and, more particularly, relates to a circuit utilized in such machines for discharging a charged cell to a predetermined cell voltage indicative of discharge of the total capacity of the cell.

Electrochemical cells such as nickel cadmium are typically capacity graded as a means of quality control as well as to obtain matched capacity cells for making a battery of series-connected cells.

One prior art apparatus for capacity grading cells is a circuit board in which a plurality of cells are connected in series with a rheostat discharge load. The cells are graded using this apparatus by (1) inserting a plurality of cells in the board, (2) allowing the cells to discharge at constant current while periodically manually checking each of the cells with a voltmeter to measure cell voltage, (3) manually removing cells which have a voltage indicative of substantially total discharge of the capacity of the cell, (4) manually adjusting the rheostat to maintain a constant current discharge for the remaining cells, and (5) sorting the cells based on total discharge time. Such prior art methods require substantial manual labor and are, therefore, costly and unnecessarily complicated.

It is, therefore, an object of this invention to provide a circuit which automatically discharges cells and monitors the cell voltage for use in an automated cell capacity grading machine.

SUMMARY OF THE INVENTION

These and other objects are accomplished by a circuit comprising a constant current power supply connected to a cellholder such that a cell in said holder is discharged to a predetermined voltage indicative of substantially total discharge of the cell capacity. A switch means is connectible in parallel across the cellholder for bypassing current from said supply around the cell and terminating discharge of the cell. An indicator means is actuated responsive to the termination of discharge of the cell and initiates cell ejection from the holder. The cells and cellholders are located on a movable transport resulting in the ejection of the cell at spaced locations, each location corresponding to predetermined discharge times.

DESCRIPTION OF THE PREFERRED EMBODIMENTS

Figure 1:
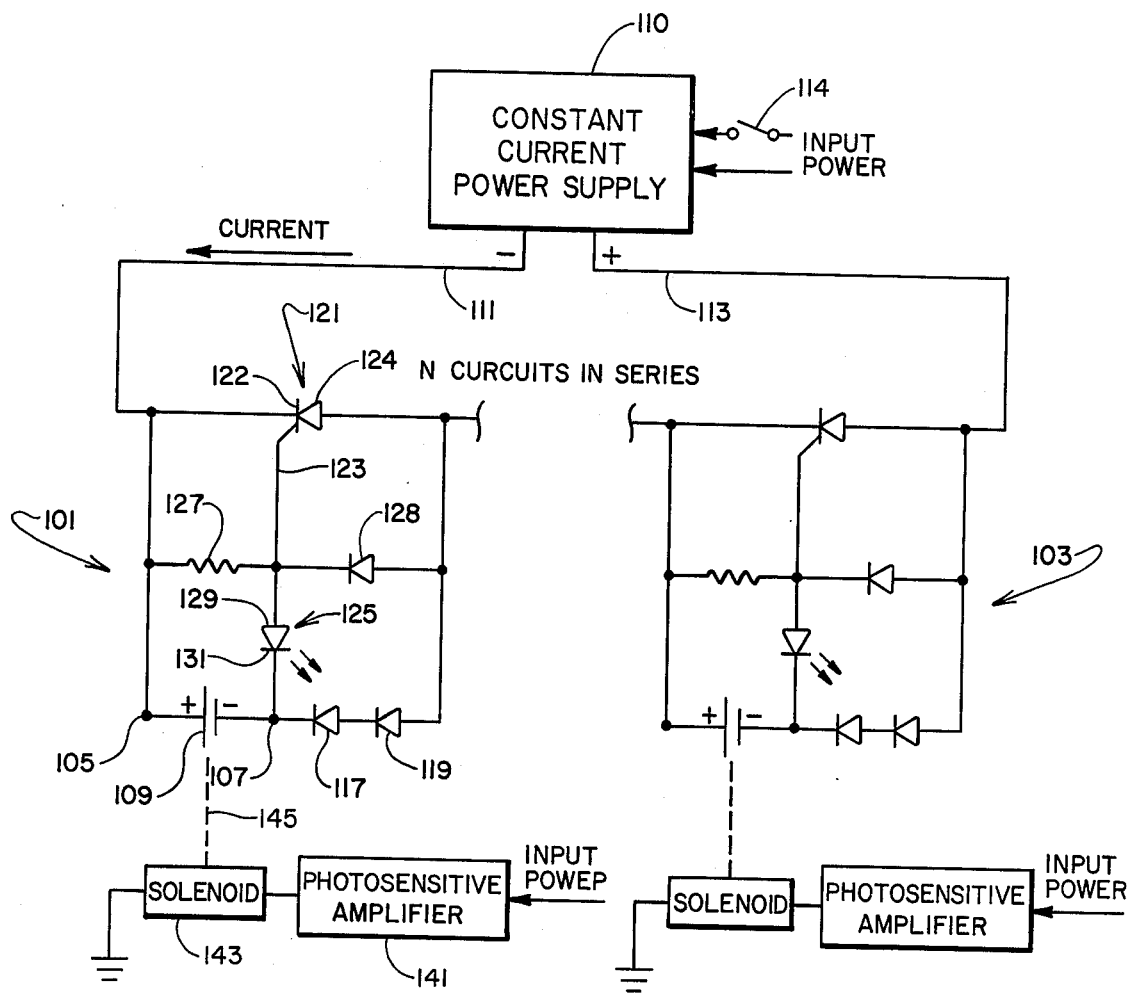
FIG. 1 is a diagram of a circuit in accordance with this invention.

Referring to the FIG. 1, a circuit is shown for discharging and monitoring the voltage of each of a plurality of cells. The circuit may be utilized in a battery grading machine to measure to individual cell capacities, for example, of nickel cadmium cells. The circuit is comprised of N (where N is an integer) series-connected subcircuits, each of which is associated with one cell. Two such individual circuits 101, 103 are shown in FIG. 1. The invention will be explained in connection with circuit 101, which is representative of circuit 103 and others not shown. Circuit 101 is comprised of a cellholder which is represented schematically by a positive terminal 105, and a negative terminal 107. The cellholder may be of any conventional construction such as a cupshaped housing. The housing preferably has an interior dimension corresponding to that of a cell and has a spring actuated latch closing the open end of the housing for latching a cell in place as will be explained in more detail below. The cellholder is shown herein with a cell 109 mounted therein. The cellholder is connected to a constant current power supply 110, with negative and positive terminals 111, 113. The power supply 110 provides a driving current which forces the cell to discharge through a pair of diodes 117, 119. Activation of the supply 110 is controlled by a switch 114.

Discharge of cell 109 is controlled by a parallel bypass switching means or SCR 121, which has a cathode 122, gate 123, and anode 124. SCR 121 is connectable in parallel with the cellholder for abruptly changing back and forth between a non-conductive and a conductive state responsive to the voltage of cell 109. A bias resistor 127 and diode 128 are connected respectively between cathode 122 and gate 123 and between anode 124 and gate 123 for acting as a voltage divider to insure gate trigger control. When a charged cell is initially placed in the cellholder, the cell voltage commutates the switching means or SCR 121 in a non-conductive state. As cell 109 is discharged, the voltage drops across the anode 124 to cathode 122 and the gate 123 to cathode 122 increase. At the end of discharge or end of capacity, these voltages are sufficient to trigger SCR 121 into conduction to provide a by-pass current path around the cell for the driving current from supply 110. The switching of SCR 121 to a conductive state terminates discharge of cell 109. This condition is detected by an indicating means here shown as a light emitting diode (LED) 125 having an anode 129 connected to SCR gate 123 and cathode 131 connected to the negative terminal 107 of the cellholder. When the LED 125 is illuminated, this condition is detected by a photosensitive amplifier 141 which in turn provides an input signal to a solenoid 143. Solenoid 143 is connected by any conventional mechanical linkage 45 to the cellholder for ejecting the cell upon solenoid actuation. One preferred linkage is an air cylinder linkage which is comprised of an air cylinder for driving a reciprocating rod connected to the latch for the cellholder. In this linkage, the solenoid 141 operates an air supply valve to pressurize the air cylinder and in turn activates the rod to unlatch the cell in the cellholder.

Figure 3:
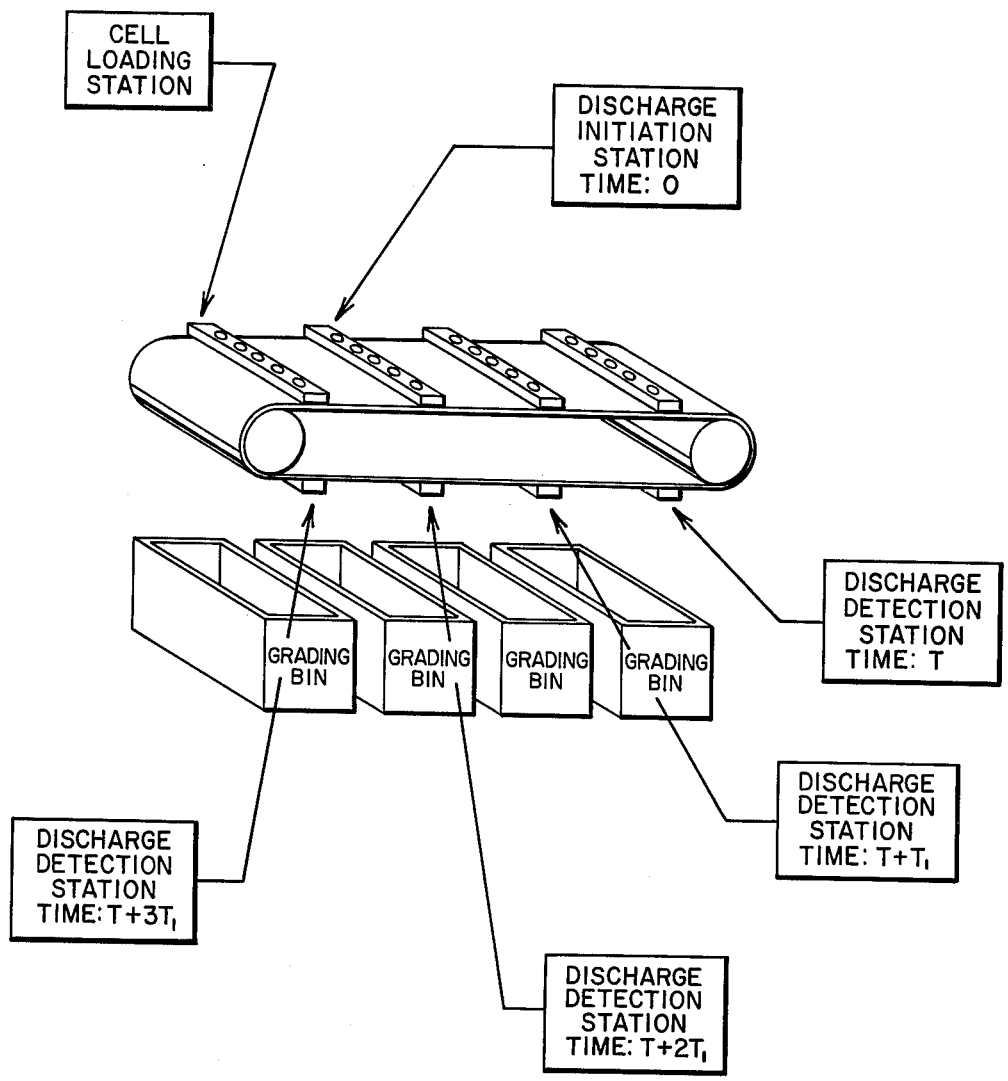
FIG. 3 is a schematic diagram of a method for capacity grading cells in accordance with this invention.

The discharge time may be recorded in a number of ways apparent to those skilled in the art. However, one preferred method in accordance with the features of this invention, as shown schematically in FIG. 3, is to fix the circuit of FIG. 1, except for amplifier 141 and solenoid 143, on a movable transport means such as an intermittently driven closed loop belt conveyor system. The cells are automatically or manually loaded in cellholders one row at a time in rows which are disposed transversely of the conveyor belt. After loading one row, the belt is indexed and the power supply 110 is activated by closing switch 114 to start the discharge of the cells in that row. The loading and indexing steps are continued on an alternate basis. The first loaded row is thus progressively transported around the belt so as to approach a plurality of discharge detection stations which are located at spaced locations along the lower half of the conveyor belt. One or more photosensitive amplifiers, such as amplifier 141 (FIG. 1), are located above and transversely of the lower half of the belt. Alternative arrangements for the amplifiers are to have either one amplifier which is driven along the stationary row (between index steps) or a plurality of amplifiers equal in number and corresponding to the cellholders in the row and located above and transversely of the lower half of the belt. As the rows of cells are progressively indexed to each discharge detection station, the photosensitive amplifier(s) receives a light signal from any LED (such as LED 125, FIG. 1) which has been illuminated since passing the next adjacent discharge detection station upstream from the present station. Upon sensing of the LED illumination, the cell in the corresponding cellholder is ejected by release of the latch which permits the cell to slide downwardly due to the force of gravity on the cell into a bin located below each discharge detection station. As a result, each bin contains cells only which have been discharged, at a constant rate, within a predetermined range of discharge times. The cells in each bin are sorted based on their available capacity. The range of capacities or discharge times within each bin is determined by the indexing interval of the belt between each detection station (except for the first station which is positioned to correspond to the anticipated minimum discharge time of any cell). After ejection, the LED 125 is turned off and the current is continued to be by-passed through the SCR 121.

Figure 2:
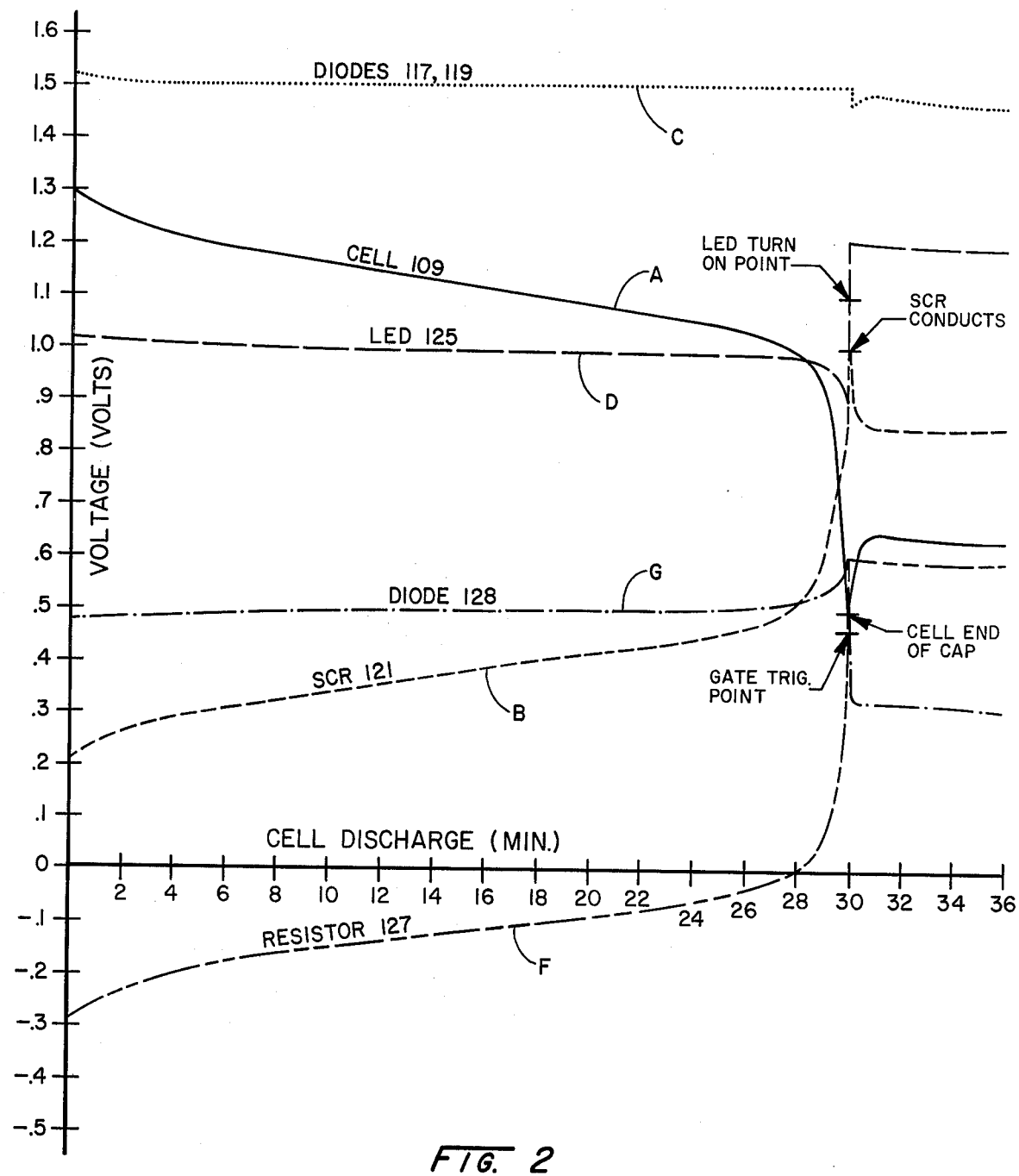
FIG. 2 is a graph of the voltage versus cell discharge time of one embodiment of the circuit of FIG. 1.

For an explanation of the operation of a specific example of an embodiment of the invention, reference is made to FIG. 2 which illustrates the voltage on each circuit components listed below as a function of discharge time. The values used herein to illustrate the operation are intended to be exemplary only and other arrangements and values will be apparent to those skilled in the art.

| Component | Size |
|---|---|
| SCR 121 | 3 A |
| Resistor 127 | 470 |
| Diode 129 | 50 mA (silicon) |
| LED 125 | infrared, low voltage forward drop 1.3 volts |
| Diode 117 | 3A (silicon) |
| Diode 119 | 3A (silicon) |
| Cell 109 | 1 Ah.-N/Cd |

By reference to Curve A, it is seen that when a charged nickelcadmium cell 109 is inserted into the cellholder, it has an initial voltage of approximately 1.3 volts. The voltage drop across diodes 117, 119, approximately 1.5 volts, (Curve C) is opposite in polarity to cell 109. This places a net voltage of approximately 0.2 volt (Curve B) drop across SCR 121 (anode 124 to cathode 122) which places SCR 121 in a nonconductive state.

The constant current power supply 110 provides a two ampere driving current, the majority of which passes through cell 109 discharging in into diodes 117, 119. During the discharge of cell 109, LED 125 (Curve D) has a voltage drop across it of approximately one volt which is insufficient to cause light emission. As the cell capacity and cell voltage (Curve A) decrease, the voltage across the anode 124 to cathode 122 (Curve B) and gate 123 to cathode 122 (Curve F) of SCR 121 correspondingly increase. The voltage anode 124 to gate 123 (Curve G) of SCR 121 remains substantially constant during discharge. When the capacity of a cell 109 is near exhaustion at a value of approximately .5 volts, SCR 121 is turned on at this point with a voltage drop of 1 volt being developed across the SCR 121, anode 124 to cathode 122 and a .5 volt drop being developed across SCR 121, gate 123 to cathode 122. The voltage drop anode 124 to cathode 122 of SCR 121 is the sum of the cell voltage and the voltage drop on diodes 117, 119. The voltage drop gate 123 to cathode 122 of SCR 121 is developed across resistor 127, the remainder of the total voltage anode 124 to cathode 122 being developed across diode 128 (Curve G).

Also, at the end of cell capacity (0.5 cell voltage) cell voltage is clamped at approximately 0.6 volts which is due to the SCR 121 having a forward drop of 0.9 volts cathode to anode minus the forward drop of diodes 117, 119 of 1.5 volts. This prevents further cell discharge and insures that the cell cannot go into reversal (that is, the cell cannot be discharged beyond the available capacity of the plates of the cell).

LED 125 is turned on when the cell reaches 0.5 volts and the SCR 121 is in a conductive state. A voltage of 1.25 volts is required to turn on LED 125. This voltage is supplied by the SCR 121 forward drop (anode 124 to gate 123) which is 0.65 volts plus the "clamped" cell voltage of 0.6 volts. After LED is lit, the light is preferably electrically detected such as by a photosensor 141 which activates solenoid 143 to unclamp the cell and allow the cell to slip the cellholder due to the force of gravity on the cell.

After removal of the cell from circuit 101, the SCR 121 continues to be a conductive state and to by-pass current around the empty cell holder. In this condition only the SCR anode to gate voltage of 0.65 volts is applied to the LED and, therefore, it ceases to emit light. Thus, no further signals to eject a cell from this cellholder are generated. SCR 121 remains in a conductive state until fully charged cell is inserted into the cellholder which then reduces the voltage drop across the SCR 121 anode to cathode to a sufficient level to force SCR 121 into a non-conductive state. The inserted cell is then discharged in the manner explained above.

Other features of this circuit are that in the case of power failure a charged cell cannot self-discharge because its voltage is insufficient to force either the combination of diodes 117 and 119 or diode 125 and resistor 127 into conduction.

Another feature of the invention is that cell energy is dissipated in diodes 117 and 119 which allows a low power dissipation current regulated power supply to be used for constant current power supply 110.

A variation of this invention which will decrease leakage light current in LED 125 (FIG. 1) which may occur due to variable performance characteristics of LED's is to substitute a resistor for diode 128 (FIG. 1). This and other variations which will be apparent to those skilled in the art are intended to be within the scope of the appended claims.

I claim:

1. A circuit for measuring the capacity of electrochemical cells comprising:
    (a) a constant current power supply for establishing a discharge rate for the cell;
    (b) a cellholder connected to said supply with negative and positive supply terminals connected to the positive and negative cellholder terminals so as to provide a discharge path for the cell, said discharge path including said constant current power supply;

(c) a switching means connectable in parallel with said holder for abruptly changing from a non-conductive to a conductive state responsive to the voltage of a cell disposed in said holder and providing a by-pass current path around said cell to thereby terminate discharge of a cell in said holder when said cell voltage attains a given value; and (d) means for indicating the termination of discharge of a cell in said holder.

2. The circuit of claim 1 wherein said switch means is an SCR.

3. The circuit of claim 2 wherein said indicating means is a light emitting diode, said light emitting diode having an anode connected to the gate of said SCR and a cathode connected to one terminal of said holder.

4. The circuit of claim 1 wherein said indicating means includes a light emitting element responsive to termination of discharge, the circuit further comprising a photosensor disposed to sense light from said light emitting element and ejection means coupled to said photosensor for ejecting a cell mounted in said holder upon detection by said photosensor of light from said light emitting element.

5. The circuit of claim 1 further comprising diode means connectable in a series path with the cell during discharge thereof and having a substantially constant voltage drop thereacross opposite in polarity to the voltage of a cell in said holder, said switch means being responsive to the voltage developed across at least part of such series path during discharge.

6. The circuit of claim 5 wherein said switch means is connected to said cellholder in a circuit path parallel to said series path which includes said cell and said diode means.

7. The circuit of claim 6 wherein said switch means is an SCR and said diode means is a pair of diodes.

8. An apparatus for use in measuring the capacity of a plurality of cells comprising:

(a) a constant current power supply for establishing a discharge rate for the cells;

(b) a plurality of series connected circuits, each circuit comprising:

(i) a cellholder connected to said supply with negative and positive supply terminals connected in circuit with the positive and negative cellholder terminals, respectively so as to provide a discharge path for the cells disposed in each said cellholder.

(ii) a switching means connectable in parallel with said holder for changing from a non-conductive to a conductive state responsive to the voltage of a cell disposed in said holder and providing a by-pass current path around said cell to thereby terminate discharge of a cell in said holder while providing a constant current path to the other of said cellholders; and (iii) means for indicating the termination of discharge of a cell in said holder.

9. The circuit of claim 8 wherein said switch means is an SCR.

10. The circuit of claim 9 wherein said indicating means is a light emitting diode, said light emitting diode having an anode connected to the gate of said SCR and cathode connected to one terminal of said holder.

11. The circuit of claim 8 further comprising diode means connected in a series path with the cell during discharge thereof and having a substantially constant voltage drop thereacross opposite in polarity to the voltage of a cell in said holder said switch means being responsive to the voltage developed across at least part of said series path during discharge.

12. The circuit of claim 11 wherein switch said means is connected to said cellholder by connection of a first terminal of said switch means to the positive cellholder terminal and a second terminal of said switch means connected to a second terminal of said diode means.

13. The circuit of claim 12 wherein said switch means is an SCR and said diode means is a pair of diodes.

14. The circuit of claim 8, wherein said indicating means includes a light emitting element responsive to termination of discharge, the circuit further comprising a photosensor disposed to sense light from said light emitting element and ejection means coupled to said photosensor for ejecting a cell mounted in said holder upon detection by said photosensor of light from said light emitting element.

15. A method for capacity grading a cell comprising the step of:

(1) loading, at a cell loading station, a plurality of cells in a row of cellholders disposed transversely of a longitudinally movable transport means;

(2) initiating the discharge of the cells in said row;

(3) detecting the substantially complete discharge of the cells as the cells are moved by said transport means; and (4) ejecting the cells from said cellholders in said row at spaced longitudinal positions of said transport means, said longitudinal position of ejection of a cell being determined by the total discharge time of the cell.

16. The method of claim 15 wherein said detecting step comprises the steps of (1) generating a plurality of signals, each signal being generated responsive to the substantially complete discharge of one of the cells in said row; and (2) moving said transport means with said row of cells thereon past a plurality of longitudinally spaced discharge detection stations, each station comprising means for detecting the substantially complete discharge of any of the cells in said row, the location of said spaced positions being determined by the location of said stations.

17. The method of claim 15 wherein steps (1) to (4) are repeated for a plurality of rows of cellholders disposed transversely of said transport means.

18. The method of claim 15 wherein said transport means is a closed loop conveyor belt.

19. The circuit of claim 1, wherein said indicating means comprises ejection means associated with said cellholder for ejecting discharged cells from said cellholder after discharge thereof has been terminated.

20. The circuit of claim 8, wherein said indicating means comprises ejection means associated with each said cellholder for ejecting discharged cells from their respective cellholders after discharge thereof has been terminated.

21. The circuit of claim 14, wherein said photosensor is disposed at a detection station, and further comprising cellholder transport means for moving the cellholders in mutually displaced relation past said detection station.

22. The circuit of claim 21, further comprising at least one further detection station mutually displaced from said first detection station in the direction of cell transportation so as to provide for ejection of said cells at separate detection stations in accordance with the time required for discharge thereof.

23. A circuit for the controlled discharge of an electrochemical cell, comprising:
  (a) a current source;
  (b) diode means connected in a series path with the current source and the cell to provide a forward discharge current path for the cell, said diode means developing a known voltage drop thereacross during discharge of the cell;
  (c) electronic switch means connected to provide a by-pass path around said series path for the current from said current source, said switch means having a control electrode; and
  (d) voltage reference means connected between at least one terminal of said series path and said control electrode for developing a voltage level on said control electrode sufficient to energize said switch means when the voltage of the cell is diminished by discharge to a predetermined value.

24. The circuit of claim 23, wherein the electronic switch means comprises an SCR providing said by-pass path via the anode and cathode terminals thereof, and wherein the voltage reference means comprises at least one forwardly biased diode coupled between the control electrode for said SCR and one of said anode and cathode terminals to provide a trigger voltage on said control electrode, relative to said cathode terminal, when the voltage of said cell reaches predetermined minimum value.

25. The method of claim 16, wherein said signals are light signals and said detection stations are responsive to said light signals.

* * * * *